US012772908B2

(12) United States Patent
Helbing et al.

(10) Patent No.: US 12,772,908 B2
(45) Date of Patent: Oct. 20, 2026

(54) LIGHT-EMITTING DEVICE ARRAY WITH INDIVIDUAL CELLS

(71) Applicant: BRIDGELUX, INC., Fremont, CA (US)

(72) Inventors: Rene Peter Helbing, Fremont, CA (US); Tao Xu, Fremont, CA (US)

(73) Assignee: BRIDGELUX, INC., Fremont, CA (US)

( * ) Notice: Subject to any disclaimer, the term of this patent is extended or adjusted under 35 U.S.C. 154(b) by 0 days.

(21) Appl. No.: 18/494,724

(22) Filed: Oct. 25, 2023

(65) Prior Publication Data

US 2024/0136338 A1 Apr. 25, 2024
US 2024/0234387 A9 Jul. 11, 2024

Related U.S. Application Data

(63) Continuation of application No. 16/997,691, filed on Aug. 19, 2020, now Pat. No. 11,830,857, which is a
(Continued)

(51) Int. Cl.

*H10W 90/00* (2026.01)
*H10H 20/851* (2025.01)
*H10H 20/854* (2025.01)
*H10H 20/01* (2025.01)
*H10H 20/832* (2025.01)
(Continued)

(52) U.S. Cl.
CPC ........ *H10W 90/00* (2026.01); *H10H 20/8513* (2025.01); *H10H 20/8515* (2025.01); *H10H 20/854* (2025.01); *H10H 20/034* (2025.01); *H10H 20/0361* (2025.01); *H10H 20/0362* (2025.01); *H10H 20/0363* (2025.01); *H10H 20/832* (2025.01); *H10H 20/833* (2025.01); *H10H 20/851* (2025.01); *H10H 20/8512* (2025.01); *H10W 72/07351* (2026.01); *H10W 72/30* (2026.01)

(58) Field of Classification Search
CPC ........... H10W 90/00; H10W 72/07351; H10W 72/30; H10H 20/8513; H10H 20/8515; H10H 20/854; H10H 20/034; H10H 20/0361; H10H 20/0362; H10H 20/0363; H10H 20/832; H10H 20/833; H10H 20/851; H10H 20/8512
See application file for complete search history.

(56) References Cited

U.S. PATENT DOCUMENTS 9,373,606 B2 * 6/2016 Helbing .................. H01L 33/56
10,756,066 B2 * 8/2020 Helbing .............. H01L 25/0753
(Continued)

*Primary Examiner* — Su C Kim
(74) *Attorney, Agent, or Firm* — ArentFox Schiff LLP

(57) ABSTRACT

A light-emitting device and a method for manufacturing the light-emitting device is disclosed. Such a light-emitting device comprises a substrate, a plurality of cells disposed on the substrate, and a plurality of semiconductor dice, wherein each of the plurality of cells accommodates at least one of the plurality of dice. Each of the plurality of cells may be filled with an encapsulant, phosphor or a mixture of an encapsulant with phosphor to control light characteristics of the light-emitting device. In an alternative aspect, cells may be filled with an encapsulant, and comprise a transparent cover coated with or filled with phosphors to control light characteristics of the light-emitting device.

15 Claims, 7 Drawing Sheets

Related U.S. Application Data continuation of application No. 15/149,011, filed on May 6, 2016, now Pat. No. 10,756,066, which is a continuation of application No. 12/871,774, filed on Aug. 30, 2010, now Pat. No. 9,373,606.

(51) Int. Cl.

| | |
|---|---|
| *H10H 20/833* | (2025.01) |
| *H10W 72/00* | (2026.01) |
| *H10W 72/30* | (2026.01) |

(56) References Cited

U.S. PATENT DOCUMENTS

| | | | | |
|---|---|---|---|---|
| 11,830,857 | B2 * | 11/2023 | Helbing | H01L 25/0753 |
| 2006/0245208 | A1 * | 11/2006 | Sakamoto | G02F 1/133603<br>362/240 |
| 2008/0187746 | A1 * | 8/2008 | De Graaf | C09K 11/7774<br>264/21 |
| 2009/0140630 | A1 * | 6/2009 | Kijima | C09K 11/778<br>313/498 |
| 2010/0001297 | A1 * | 1/2010 | Takashima | H10H 20/856<br>257/E33.056 |
| 2010/0102340 | A1 * | 4/2010 | Ooya | H01L 33/507<br>257/98 |
| 2010/0164346 | A1 * | 7/2010 | Li | F21V 7/0008<br>313/46 |
| 2010/0301367 | A1 * | 12/2010 | Nakamura | H10D 62/054<br>257/E33.059 |

* cited by examiner

LIGHT-EMITTING DEVICE ARRAY WITH INDIVIDUAL CELLS

CROSS-REFERENCE TO RELATED APPLICATIONS

This application is a continuation of U.S. patent application Ser. No. 16/997,691, filed on Aug. 19, 2020, which is a continuation of U.S. patent application Ser. No. 15/149,011, filed May 6, 2016, now U.S. Pat. No. 10,756,066, which is a continuation of U.S. patent application Ser. No. 12/871,774, filed Aug. 30, 2010, now U.S. Pat. No. 9,373,606, the disclosures of each of which are hereby incorporated by reference in their entireties.

BACKGROUND

1. Field

The present disclosure relates to a light-emitting device, and more particularly, to a method and an apparatus for light-emitting device arrays.

2. Description of Related Technology

A person skilled in the art will appreciate that the concepts disclosed herein are applicable to packages for semiconductor-based light-emitting device, namely a light-emitting diode (LED) device.

LEDs have been used for many years in various light requiring applications, e.g., signaling states for devices, i.e., light on or off, opto-couplers, displays, replacement of bulbs in flashlights, and other applications known in the art. Consequently, LEDs emitting both spectral colors and white light have been developed. There are two primary approaches to producing light with desired properties using LEDs. One is to use individual LED dice that emit the three primary colors—red, green, and blue, and then mix the colors to produce light with the desired properties. The other approach is to use a phosphor material to convert monochromatic light from a blue or ultra-violet color emitting LED die or dice to a light with the desired properties, much in the same way a fluorescent light bulb works. For the purposes of this disclosure a die has its common meaning of a light-emitting semiconductor chip comprising a p-n junction.

Due to LEDs' advantages, i.e., light weight, low energy consumption, good electrical power to light conversion efficiency, and the like, an increased interest has been recently focused on use of LEDs even for high light intensity application, e.g., replacement of conventional, i.e., incandescent and fluorescent light sources, traffic signals, signage, and other high light intensity applications known to a person skilled in the art. It is customary for the technical literature to use the term "high power LED" to imply high light intensity LED; consequently, such terminology is adopted in this disclosure, unless noted otherwise. To increase intensity of the light emitted by the light-emitting device, often more than one light-emitting die is arranged in a package; such a light-emitting device being termed a light-emitting device array. For the purposes of this disclosure, a package is a collection of components comprising the light-emitting device including but not being limited to: a substrate, a die or dice (if an array), phosphors, encapsulant, bonding material(s), light collecting means, and the like. A person skilled in the art will appreciate that some of the components are optional.

A conceptual structure of an exemplary light-emitting device array 100 in accordance with known concepts is depicted in FIG. 1. A substantially flat substrate 102 in addition to being a mechanical support for the electrical and optical layers of the light-emitting device is often used as means for heat dissipation from the light-emitting device array. The electrical and optical layers comprise all the components of the package, excluding the substrate 102. When used as means for heat dissipation, the substrate 102 is made from a material with high thermal conductivity. Such material may comprise metals, e.g., Al, Cu, Si-based materials, ceramics such as AN, or any other material whose thermal conductivity is appropriate for the light-emitting device array in question. A person skilled in the art will appreciate that material appropriate for a light-emitting device array with power dissipation of, e.g., 35 milliwatts (mW) is different than material appropriate for a light-emitting device array with power dissipation of, e.g., 350 mW. A material is considered to be substantially flat if the irregularities in flatness would not cause light to be reflected by such irregularities.

The source of light comprises a plurality of dice 114 (three dice shown), disposed on an upper face 104 of the substrate 102. A person skilled in the art will appreciate that the number of dice is a design decision, and different number of dice can be used to satisfy design goals.

To improve light extraction from the light-emitting device array 100, several measures are taken. First, surfaces that are transparent to photons emitted at a particular wavelength or that have poor reflectivity of such photons in an undesirable direction of emission may be treated, e.g., by polishing, buffing, or any other process, to acquire a specific reflectivity. Reflectivity is characterized by a ratio of reflected to incident light. Such surfaces are an upper face 104 of the substrate 102 and inner wall 106 of a support member 108. The support member 108 provides boundary for an encapsulant 110 and reflects light emitted by the dice 114 into desirable direction. Alternatively, the desired reflectivity is achieved by applying a layer of a material with high reflectivity, such as Ag, Pt, and any like materials known to a person skilled in the art, (not shown in FIG. 1) onto such surfaces.

Furthermore, to prevent reflection of the emitted photons from boundaries between materials characterized by different refraction indexes, and, consequently, loss of light intensity, an encapsulant 110 is applied into a cavity 112, surrounding the light-emitting region, i.e., the cavity created by the substrate 102, the support member 108, and the dice 114. The material for the encapsulant 110 is selected to moderate the differences between the refraction indexes of the materials from which components creating the reflective boundaries are made. In one aspect of the disclosure the encapsulant 110 is transparent; however, the disclosed concepts apply equally to encapsulant 110 comprising fillers, e.g., phosphors used for light conversion as described above.

Additionally, light-emitting device array package may further comprise a cover 116 disposed above the dice 114. Such a transparent cover comprises e.g., a window or a lens. In order to prevent delamination of the encapsulant 110 from the surface of the cover 116 and/or the inner wall of the support member 108 and/or the dice 114 and/or the substrate 102, the cover 116 is allowed to float freely on the encapsulant 110, without being rigidly anchored onto the support member 108 with an adhesive or another fastening means. Such a configuration prevents significant residual stress, caused by temperature variation as the light-emitting device array 100 heats and cools during the device's lifetime, to develop within the encapsulant 110. Because any delamination would introduce voids in the encapsulant, the resulting internal reflection optical losses caused by the above-described difference between materials characterized by different refraction indexes would cause loss of light intensity.

Although the configuration depicted in FIG. 1 may be suitable for LED packages comprising a clear cover, it is not particularly suitable for LED package comprising a window or lens coated with or filled with phosphors; such a cover being often used for light conversion. An advantage of such a configuration is that the window or lens coated with or filled with phosphors can be matched appropriately with a LED dice of known wavelength to achieve a more precisely controlled color corrected temperature (CCT). Different windows or lenses may have different phosphor coatings or fillings, and these matched with LED dice of optimal wavelength to achieve target CCT as needed.

However, a problem with this configuration arises from the fact that the temperature of the phosphor coated or filled cover increases significantly during operation of the light-emitting device array because the conversion inefficiency of the phosphors results in generating significant heat. The increase in the temperature in turn results in decreased efficiency of the light-emitting device array due to decrease in light-conversion efficiency of the phosphors and decrease of efficiency of the die.

The above-described problem may be solved by a configuration according to FIG. 2, which depicts a conceptual cross section of another exemplary light-emitting device array 200 in accordance with known concepts. The description of like elements between FIG. 1 and FIG. 2 is not repeated, the like elements have reference numerals differing by 100, i.e., reference numeral 102 of FIG. 1 becomes reference numeral 202 in FIG. 2.

Referring to FIG. 2, the main conceptual difference from FIG. 1 is that a cover 216 coated with or filled with phosphors is attached to the upper face 218 of the thermally conductive support member 208. The bottom face 220 of the support member 208 is attached to a thermally conductive substrate 202. Thus, in this aspect, the support member further serves as supporting means for the cover 216. The cover 216, the support member 208, and the substrate 202 should be attached to one another using any thermally conductive means (not shown in FIG. 2) to maximize heat transfer between these components. By the means of example, such a thermally conductive means may comprise material such as metal filled epoxy, eutectic alloy, and any other thermally conductive means known to a person skilled in the art. Furthermore, it is desirable that the cover 216 is also made from a thermally conductive martial. Such a configuration allows heat to flow from the phosphors through the window or the lens 216 and then through the support member 208 to the substrate 202.

Since additional heat from the cover 216 is now transferred to the substrate 202, proper heat dissipation from the LED package 200 must be assured to prevent loss of efficiency due to increased temperature of the dice 114. Such heat dissipation may be achieved by proper design of the above-described components of the LED package 114. In addition, the LED package 200 may further be attached to a suitable heat sink (not shown).

In any of the above-described configurations, the LED package 200 can operate without the phosphors or the LED dice over-heating beyond temperature that would significantly decrease the efficiency of the LED dice and the phosphors. A person skilled in the art will appreciate that the term significant describes a decrease in efficiency that would cause the light-emitting device array performance fail to meet typical or minimum specification over the product life of the light-emitting device array.

The above-described structures of a light-emitting device array suffer from several shortcomings. The light-emitting device design goal determines geometry of the light-emitting device package, which in turn determines the required quantity of phosphor. Thus, any decrease in the quantity of phosphor would improve economics of production.

Additionally, the geometry of the package determines a contact area between the phosphor and the substrate, which is subject to a chemical reaction between the phosphor and substrate, resulting in, e.g., tarnishing, discoloration, and the like, of the substrate. Thus, any decrease of the contact area would decrease such undesirable effect, thus improving reliability. Furthermore, the light efficiency is limited by a light cross-talk, i.e., a condition when a light emitted by one of the plurality of dice is absorbed by one or more other dice of the plurality of dice.

Accordingly, there is a need in the art for a light-emitting device array providing solution to the above identified problems, as well as additional advantages evident to a person skilled in the art.

SUMMARY

In one aspect of the disclosure, a light-emitting device array with individual cells according to appended independent claims is disclosed. Additional aspects are disclosed in the dependent claims.

BRIEF DESCRIPTION OF THE DRAWINGS

The foregoing aspects described herein will become more readily apparent by reference to the following description when taken in conjunction with the accompanying drawings wherein.

DETAILED DESCRIPTION

Figure 1:
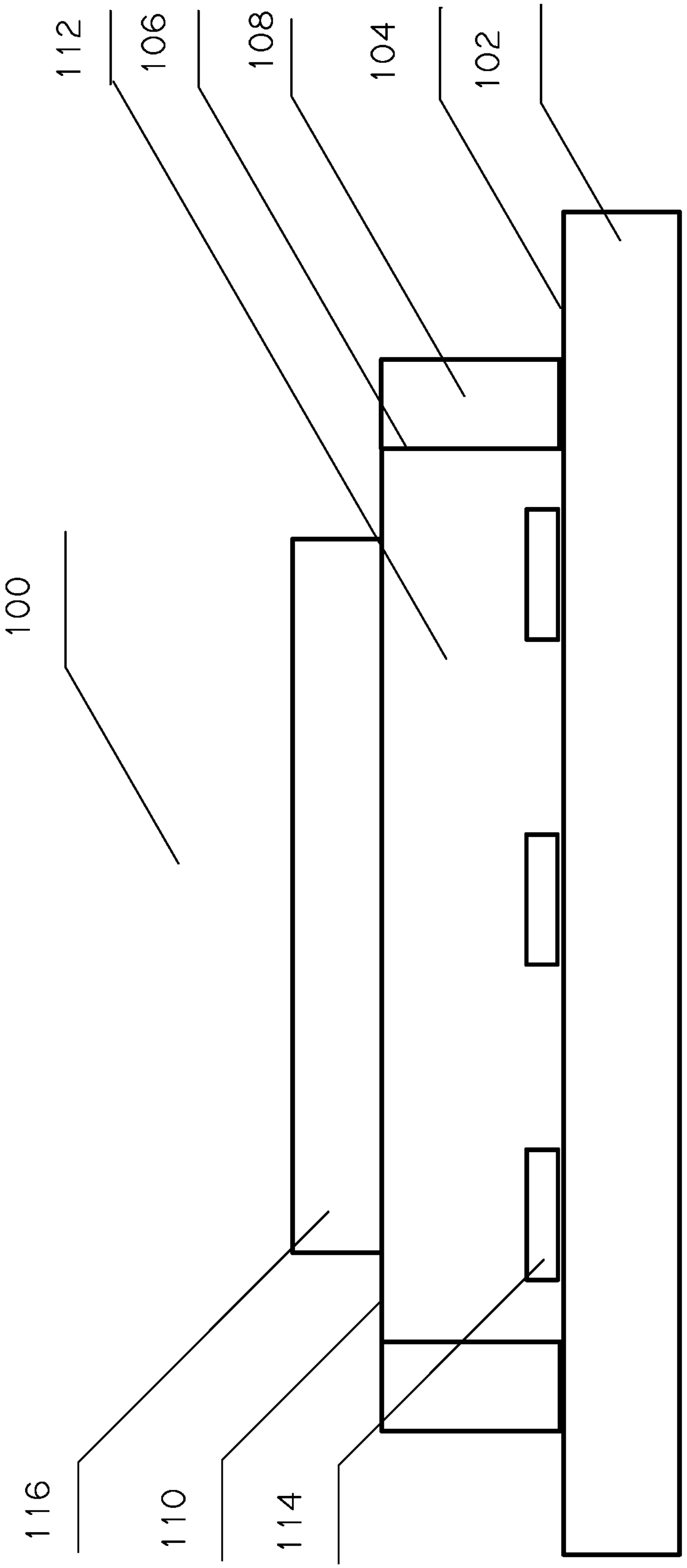
FIG. 1 depicts a conceptual structure of an exemplary light-emitting device array in accordance with known concepts.
Figure 2:
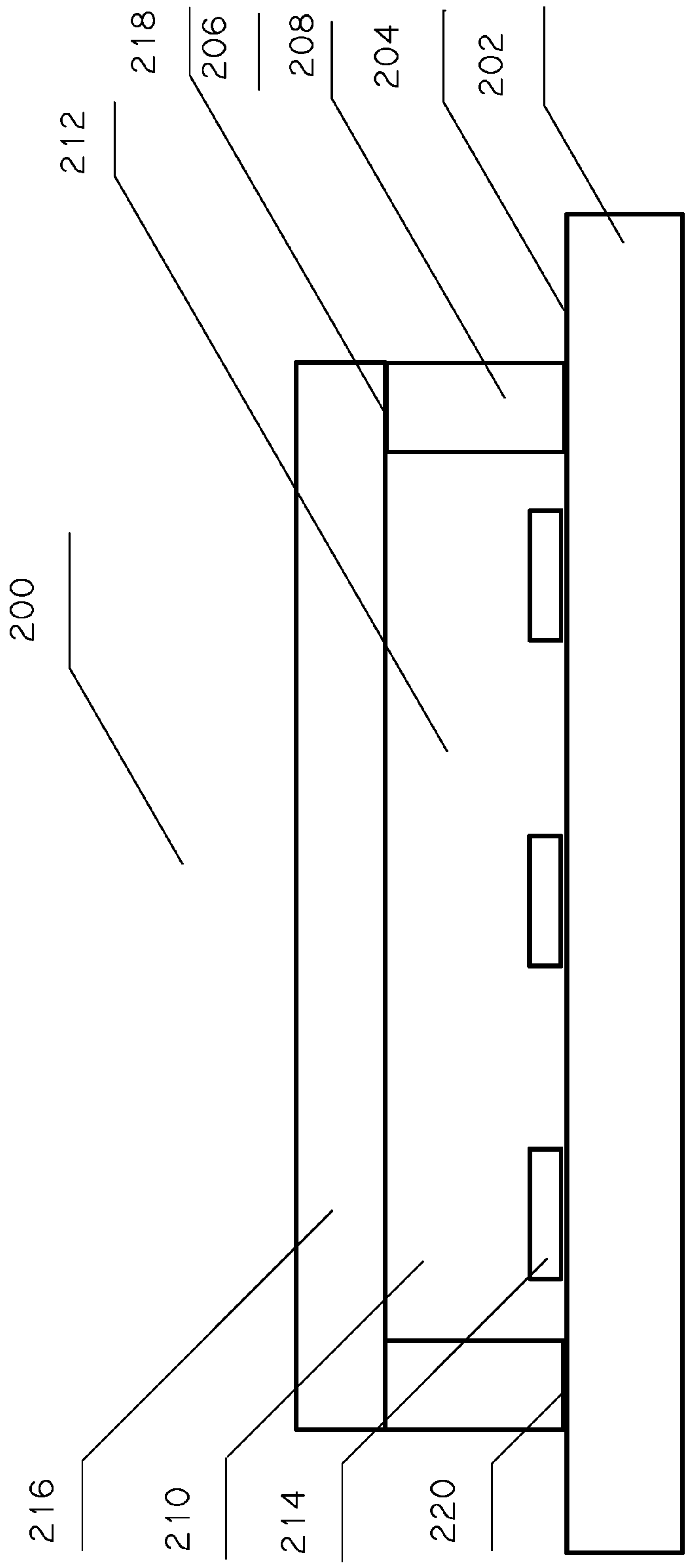
FIG. 2 depicts a conceptual structure of another exemplary light-emitting device in accordance with known concepts.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements disclosed as being on the "lower" side of other elements would then be oriented on the "upper" side of the other elements. The term "lower" can therefore encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various disclosed aspects may be illustrated with reference to one or more exemplary configurations. As used herein, the term "exemplary" means "serving as an example, instance, or illustration," and should not necessarily be construed as preferred or advantageous over other configurations disclosed herein.

Furthermore, various descriptive terms used herein, such as "on" and "transparent," should be given the broadest meaning possible within the context of the present disclosure. For example, when a layer is said to be "on" another layer, it should be understood that that one layer may be deposited, etched, attached, or otherwise prepared or fabricated directly or indirectly above or below that other layer. In addition, something that is described as being "transparent" should be understood as having a property allowing no significant obstruction or absorption of electromagnetic radiation in the particular wavelength (or wavelengths) of interest, unless a particular transmittance is provided.

Figure 3:
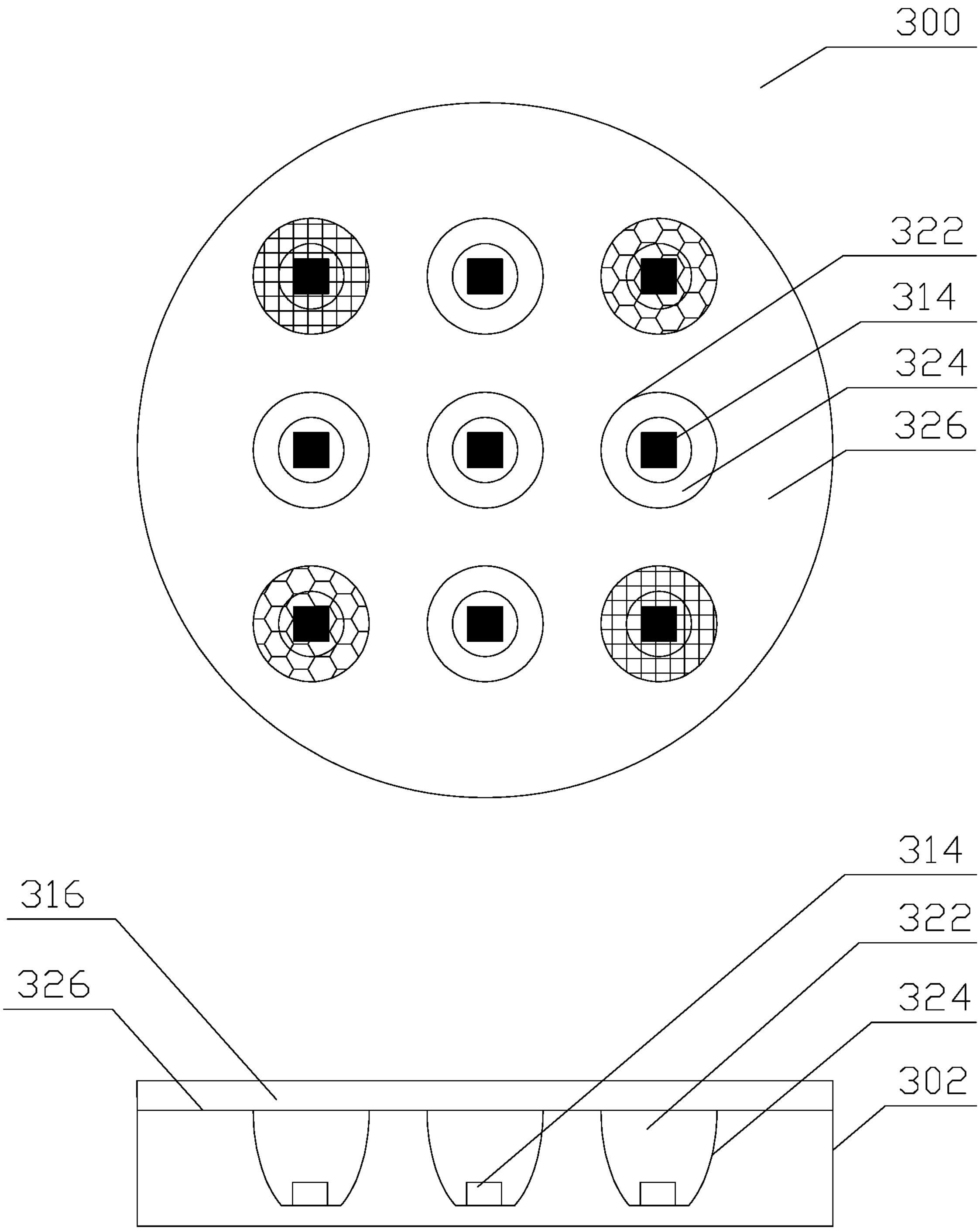
FIG. 3 depicts a conceptual structure (top and cross-section views) of an exemplary light-emitting device array in accordance with an aspect of this disclosure.

FIG. 3 depicts a conceptual structure (top and cross-section view) of an exemplary light-emitting device array 300 in accordance with an aspect of this disclosure. A plurality of cells 322 is formed in the substrate 302, each of the plurality of cells 322 accommodating at least one of plurality of dice 314. By proper design of the shape and dimensions of the plurality of cells 322, characteristics of the light emitted from the plurality of cells 322 can be controlled to eliminate or minimize the cross-talk among the plurality of dice 314.

A person skilled in the art will appreciate that additional design criteria may affect the dimensions and shape of each of the plurality of cells 322. By means of an example, a surface 324 defining a cell 322 may be shaped as a reflector to improve light extraction by focusing light emitted by a die 314 into a desired direction. Additionally, or alternatively, the surface 324 defining the cell 322 may be shaped and dimensioned to minimize volume of the cells' 322 cavity in order to minimize an amount of encapsulant, phosphor, and/or encapsulant mixed with phosphor needed to fill the cavity.

Although the surfaces 324 defining the plurality of cells 322 are shown with an identical shape and dimensions; this is for purposes of explanation of the concepts only; in different implementations, the surfaces 324 may have a different shape and/or dimensions for each of the plurality of cells 322.

To improve light extraction from the light-emitting device array 300, the surfaces 324 of the plurality of cells 322 may be treated to acquire a specific reflectivity. In one aspect, such a treatment may comprise, e.g., polishing, buffing, or any other process known to a person skilled in the art.

In an alternative aspect, the desired reflectivity may be achieved by applying a layer of reflective material on the surfaces 324 of the plurality of cells 322. To maximize luminous efficiency, material with high reflectivity, e.g., noble metals like Au, Ag, Pt, or other materials like Al, may be used for this purpose. Reflective layers employing such materials possess predominantly specular reflectivity, unless specific technological process designed to increase diffusive reflectivity is followed.

In yet another aspect, further improvement in luminous efficiency as well as in spatial light distribution may be obtained by employing reflective surfaces possessing diffusive reflectivity. Consequently, in an alternative, the reflective layer comprises a material with high diffusive reflectivity.

Although most surfaces poses a mixture of diffuse and specular reflective properties, a person skilled in the art will appreciate that the terms specular and diffuse refer to predominant mode of reflection. Thus, as disclosed above, polished or buffed metallic objects and/or layers of metallic material possess specular reflectivity; matte surfaces, usually achieved by surface roughness, possess diffuse reflectivity.

Furthermore, the upper surface 326 of the substrate 302 between the plurality of cells 322 may be treated in an identical or a similar manner in accordance with design criteria. Thus, by means of an example, the surfaces 324 of the plurality of cells 322 may be treated by polishing and/or buffing, while diffusive reflective layer may be applied on the upper surface 326 of the substrate 302.

The isolation between the plurality of cells 322 allows further control of characteristics of the light emitted by the light-emitting device 300 by enabling control of characteristics of light emitted from each individual cell 322 by an appropriate selection of a die 314, an encapsulant, phosphor and/or an encapsulant mixed with phosphor disposed into the cavity of each individual cell 322. The combination of dice, encapsulant, phosphor and/or an encapsulant mixed with phosphor for each cell in the light-emitting device 300 is a criterion criteria based on design goals. Thus, by means of an example, FIG. 3 depicts two corner cells 322, e.g., the cross-hatched cells, mixed with phosphor or an encapsulant mixed with phosphor of first color; two corner cells 322, e.g., the honeycomb-hatched cells, mixed with phosphor or an encapsulant mixed with phosphor of second color, and four cells filled with an encapsulant.

The light-emitting device array 300 may further comprise a clear transparent cover 316 used for protection of the light-emitting device array 300 from environmental conditions. The term "clear" used herein means a transparent cover without any coat or fill of phosphor(s). Such a clear transparent cover 316 comprises e.g., a window or a lens.

Alternatively, to further control characteristics of the light, the cover 316 may be coated with or filled with phosphors.

The specific configuration and placement of the transparent cover 316 is a criterion based on design goals. By means of an exemplary configuration, the transparent cover 316 may be disposed directly on, as shown in FIG. 3, or above the upper surface 326 of the substrate 302.

Figure 3A:
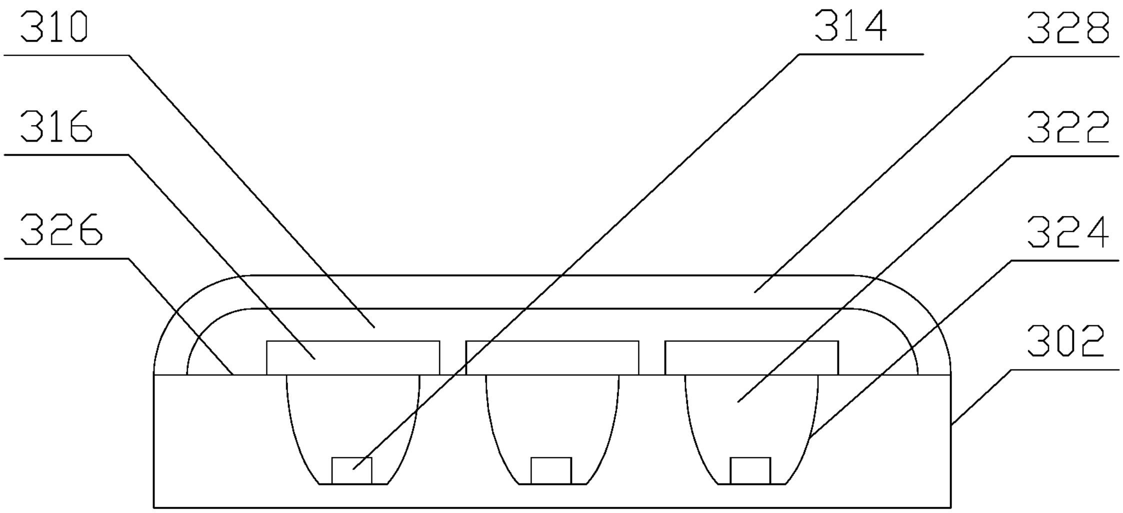
FIG. 3A depicts a cross-section view of an alternative aspect of controlling characteristics of the light emitted by the light-emitting device by controlling characteristics of the light emitted from each individual cell.

FIG. 3*a* depicts a cross-section view of an alternative aspect of controlling characteristics of the light emitted by the light-emitting device 300 by controlling characteristics of the light emitted from each individual cell 322. As depicted in FIG. 3*a*, the transparent cover comprises a plurality of transparent covers 316, each of the plurality of transparent covers 316 being disposed over one the plurality of cells 322 and being coated or filled with phosphor. Thus, the characteristics of light emitted from each individual cell 322 is controlled by an appropriate selection of the die 314 disposed in each cell 322 and phosphor used to coat or fill the transparent cover 316 disposed over each cell 322. To prevent reflection of emitted photons from boundaries between materials characterized by different refraction indexes encapsulant may be applied into the cells' 322 cavities.

An additional clear transparent cover 328 may be disposed on or above, as shown in FIG. 3*a*, the plurality of transparent covers 316 to protect the light-emitting device array 300 from environmental conditions. Alternatively, to further control characteristics of the light the cover 328 may be coated with or filled with phosphors. To prevent reflection of emitted photons from boundaries between materials characterized by different refraction indexes encapsulant may be applied into the cavity delimited by the substrate 302, the plurality of covers 316, and the cover 328.

A person skilled in the art will understand that the aspects disclosed in FIG. 3 and FIG. 3*a* regarding controlling characteristics of the light emitted from each individual cell may be combined in accordance with design goals for the light-emitting device array. Consequently, the characteristics of light emitted from each individual cell 322 may be controlled by an appropriate selection of the die 314 disposed in each cell 322; the filling material disposed into the cavity of each individual cell 322; and the transparent cover(s) 316 and/or 328. The selection of die 314 comprises selection of die with appropriate light characteristics; the filling material may comprise no filling material, an encapsulant, phosphor, and/or an encapsulant mixed with phosphor; and the transparent cover(s) 316 and/or 328 comprise any combination of clear and phosphor coated or filled cover, configured as a window or a lens.

Figure 4:
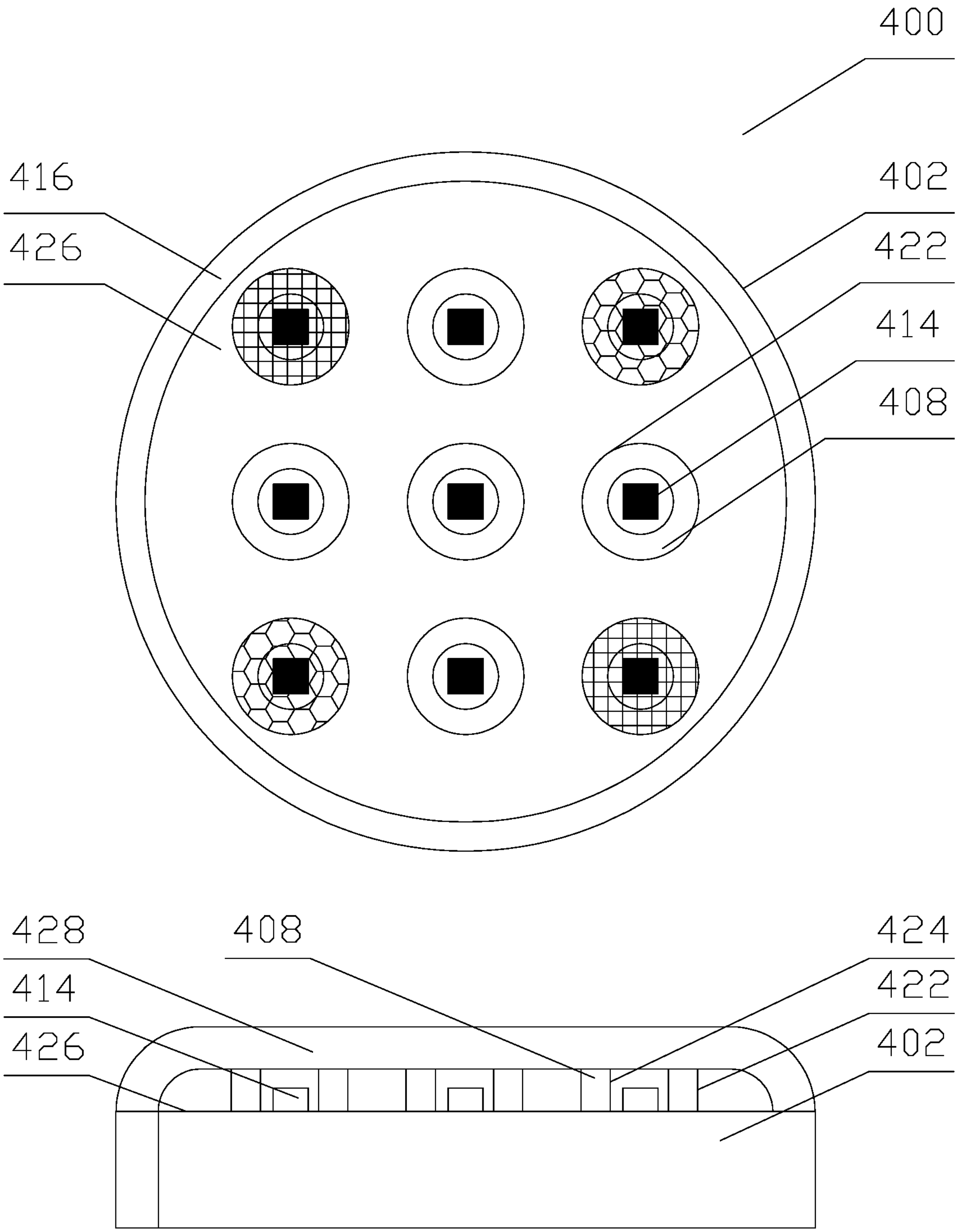
FIG. 4 depicts a conceptual structure (top and cross-section views) of an exemplary light-emitting device array in accordance with another aspect of this disclosure.

FIG. 4 depicts a conceptual structure (top and cross-section view) of an exemplary light-emitting device array package 400 in accordance with another aspect of this disclosure. A plurality of cells 422 is formed on the substrate 402, each of the plurality of cells 422 accommodating at least one of plurality of dice 414. The plurality of cells 422 is comprised of a plurality of support members 408. By proper design of the dimensions and shape of each of the plurality of support members 408, the characteristics of the light emitted from the plurality of cells 422 can be controlled to eliminate or minimize the cross-talk among the plurality of dice 414.

A person skilled in the art will appreciate that additional design criteria may affect the dimensions and shape of each of the plurality of support members 408. Thus, by means of an example, in the cross-section drawings of FIG. 4-FIG. 4*b*, a surface 424 of the support member 408, defining a cell 422 is cylindrical-shaped. However, other exemplary shapes, e.g., as described in reference to FIG. 3 are within the scope of this aspect. Although the surfaces 424 defining the plurality of cells 422 are shown with an identical shape and dimensions; this is for purposes of explanation of the concepts only; in different implementations, the surfaces 424 may have a different shape and/or dimensions for each of the plurality of cells 422.

To improve light extraction from the light-emitting device array 400, the surfaces 424 of the plurality of cells 422 may be treated to acquire a specific reflectivity. In one aspect, such a treatment may comprise, e.g., polishing, buffing, or any other process known to a person skilled in the art.

In an alternative aspect, the desired reflectivity may be achieved by applying a layer of reflective material on the surfaces 424 of the plurality of cells 422. To maximize luminous efficiency, material with high reflectivity, e.g., noble metals like Au, Ag, Pt, or other materials like Al, may be used for this purpose. Reflective layers employing such materials possess predominantly specular reflectivity, unless specific technological process designed to increase diffusive reflectivity is followed.

In yet another aspect, further improvement in luminous efficiency as well as in spatial light distribution may be obtained by employing reflective surfaces possessing diffusive reflectivity. Consequently, in an alternative, the reflective layer comprises a material with high diffusive reflectivity applied.

Although most surfaces poses a mixture of diffuse and specular reflective properties, a person skilled in the art will appreciate that the terms specular and diffuse refer to predominant mode of reflection. Thus, as disclosed above, polished or buffed metallic objects and/or layers of metallic material possess specular reflectivity; matte surfaces, usually achieved by surface roughness, possess diffuse reflectivity.

Furthermore, the upper surface 426 of the substrate 402 between the plurality of cells 422 may be treated in an identical or similar manner in accordance with design criteria. Thus, by means of an example, the surfaces 324 of the plurality of cells 322 may be treated by polishing and/or buffing, while diffusive reflective layer may be applied on the upper surface 326 of the substrate 302.

The light-emitting device array 400 further comprises a transparent cover 428. As depicted in FIG. 4, the transparent cover 428 is disposed directly on the upper face of the support members 408, thus delimiting, together with the substrate 402 and the plurality of support members 408, the cells' 422 cavity. The physical isolation between the plurality of cells 422 allows further control of characteristics of the light emitted by the light-emitting device 400 by enabling control of characteristics of light emitted from each individual cell 422 by an appropriate selection of a die 414, an encapsulant, phosphor and/or an encapsulant mixed with phosphor disposed into the cavity of each individual cell 422. The combination of dice, encapsulant, phosphor and/or an encapsulant mixed with phosphor for each cell in the light-emitting device 400 is a criterion based on design goals. Thus, by means of an example, FIG. 4 depicts two corner cells 422 filled with phosphor or an encapsulant mixed with phosphor of first color, e.g., the cross-hatched cells; two cells filled with phosphor or an encapsulant mixed with phosphor of second color, e.g., the honeycomb-hatched cells, and four cells filled with an encapsulant.

The transparent cover 428 may be clear if the cover's primary purpose is an environmental protection; alternatively, to further control characteristics of the light the cover 416 may be coated with or filled with phosphors.

Figure 4A:
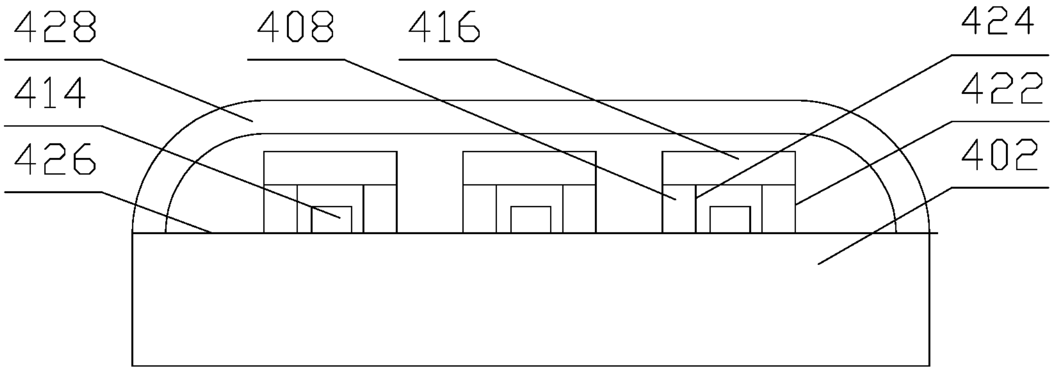
FIG. 4A depicts a cross-section view of an alternative aspect of controlling characteristics of the light emitted by the light-emitting device by controlling characteristics of the light emitted from each individual cell.

FIG. 4*a* depicts a cross-section view of an alternative aspect of controlling characteristics of the light emitted by the light-emitting device 400 by controlling characteristics of the light emitted from each individual cell 422 Like in FIG. 4, the plurality of cells 422 is comprised of a plurality of support members 408. In contrast from FIG. 4, the transparent cover comprises a plurality of transparent covers 416 in a form of a window, each of the plurality of transparent covers 416 being disposed over one the plurality of cells 422 and being coated or filled with phosphor.

Thus, the characteristics of light emitted from each individual cell 422 is controlled by an appropriate selection of the die 414 disposed in each cell 422 and phosphor used to coat or fill the transparent cover 416 disposed over each cell 422. To prevent reflection of emitted photons from boundaries between materials characterized by different refraction indexes, the cells' 422, cavity delimited by the substrate 402, the support member 408, and the plurality of covers 416 may be filled with encapsulant.

An additional clear transparent cover 428 may be disposed on or above, as shown in FIG. 4*a*, the plurality of transparent covers 416 to protect the light-emitting device array 400 from environmental conditions. Alternatively, to further control characteristics of the light the cover 428 may be coated with or filled with phosphors. To prevent reflection of emitted photons from boundaries between materials characterized by different refraction indexes encapsulant may be applied into the cavity delimited by the substrate 402, the plurality of covers 416, and the cover 428.

Figure 4B:
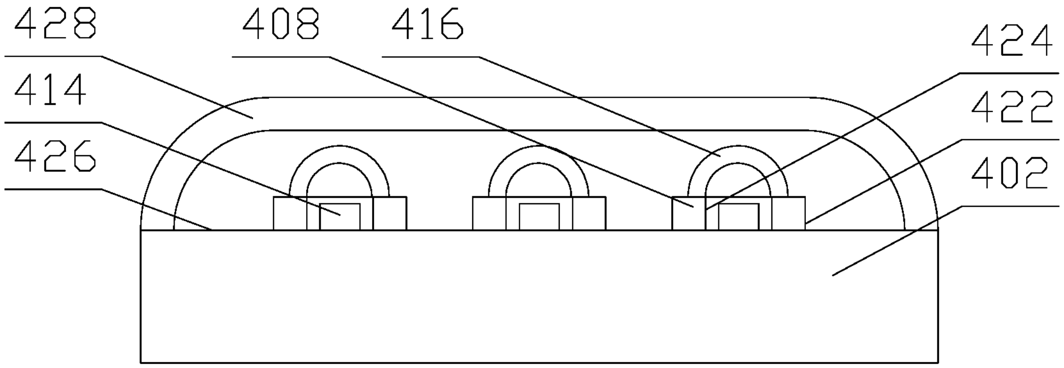
FIG. 4B depicts a cross-section view of yet an alternative aspect of controlling characteristics of the light emitted by the light-emitting device by controlling characteristics of the light emitted from each individual cell.

FIG. 4*b* depicts a cross-section view of yet an alternative aspect of controlling characteristics of the light emitted by the light-emitting device 400 by controlling characteristics of the light emitted from each individual cell 422. The difference from FIG. 4*a*, is that each of the plurality of transparent covers 416 comprise a lens to focus light emitted each of the cell's 422 into an appropriate direction.

A person skilled in the art will understand that the aspects disclosed in FIG. 4-FIG. 4*b* regarding controlling characteristics of the light emitted from each individual cell may be combined in accordance with design goals for the light-emitting device array. Consequently, the characteristics of light emitted from each individual cell 422 may be controlled by an appropriate selection of the die 414 disposed in each cell 422; the filling material disposed into the cavity of each individual cell 422; and the transparent cover(s) 416 and/or 428. The selection of die 414 comprises selection of die with appropriate light characteristics; the filling material may comprise no filling material, an encapsulant, phosphor, and/or an encapsulant mixed with phosphor; and the transparent cover(s) 316 and/or 328 comprise any combination of clear and phosphor coated or filled, window or a lens.

Figure 5:
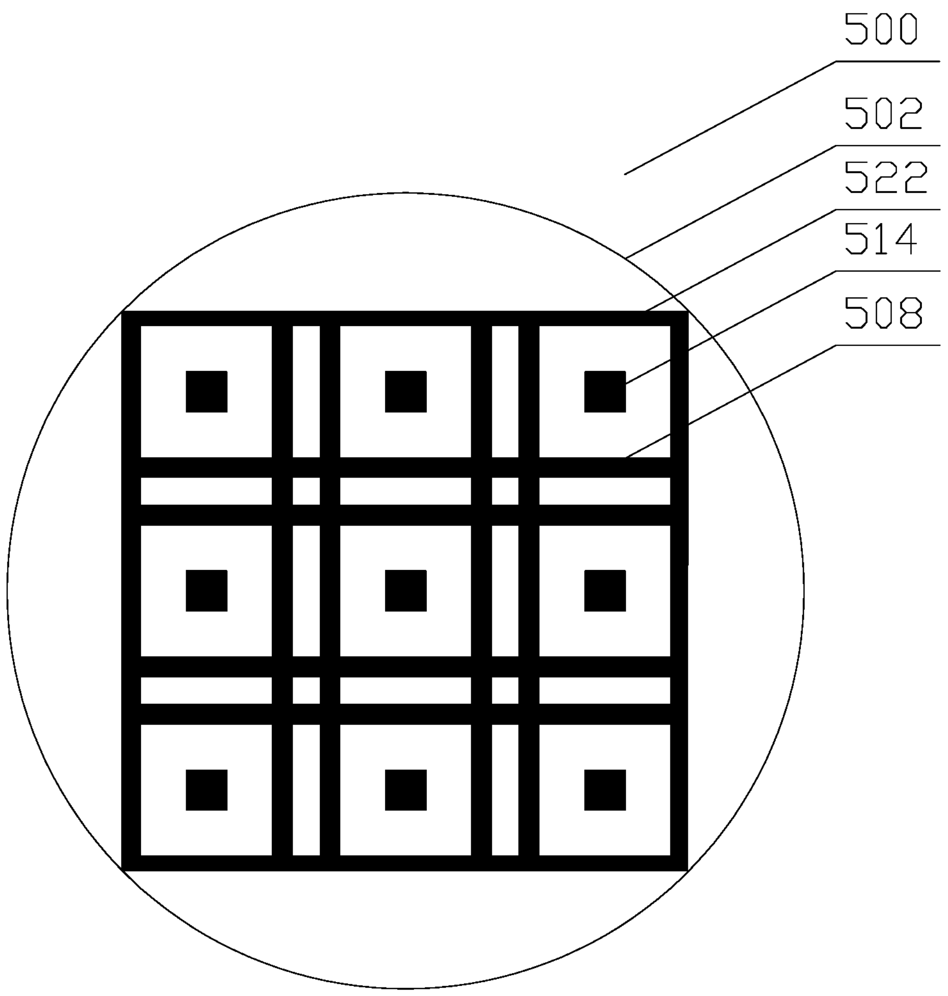
FIG. 5 depicts a conceptual structure of an exemplary light-emitting device array in accordance with yet another aspect of this disclosure.

A person skilled in the art will appreciate, that the plurality of cells may be constructed by many different technologies. In addition to the exemplary constructions disclosed in FIG. 3 and FIG. 4, the plurality of cells 522 may be constructed by dispensed material as a grid defining support members 508 on the substrate 502, using any of the dispensing techniques known to a person skilled in the art, as depicted in FIG. 5. Because FIG. 5 differs from FIG. 3 and/or FIG. 4 mainly by the technology of construction of the plurality of cells, all the concepts regarding control of characteristics of the light emitted by the light-emitting device by enabling control of characteristics of light emitted from each individual cell apply equally.

The various aspects of this disclosure are provided to enable one of ordinary skill in the art to practice the present invention. Modifications to various aspects of a presented throughout this disclosure will be readily apparent to those skilled in the art, and the concepts disclosed herein may be extended to other applications. Thus, the claims are not intended to be limited to the various aspects of the reflective surfaces for a light-emitting device array presented throughout this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A light-emitting device, comprising:

a substantially flat substrate;

a plurality of cells disposed on the substrate and defined by a plurality of support members, each support member having an upper face, the plurality of cells configured to eliminate cross-talk between a plurality of light emitting diodes (LEDs);

a plurality of transparent covers being disposed directly on the upper faces of the support members to close a corresponding cell cavity, each transparent cover comprising a lens to focus light emitted from the corresponding cell into an appropriate direction;

a reflective surface that is applied to a top surface of the plurality of cells;

the LEDs, wherein each of the plurality of cells accommodates at least one of the plurality of LEDs; and a single outer cover disposed over the substrate that is in contact with the top surface of the substrate, wherein an encapsulant mixed with phosphor is disposed into at least two of the plurality of cells such that at least two of the plurality of cells contain the encapsulant mixed with phosphor of different colors.

2. The light-emitting device according to claim 1, wherein an encapsulant is disposed into each of the plurality of cells.

3. The light-emitting device according to claim 1, wherein phosphor is disposed into at least one of the plurality of cells.

4. The light-emitting device according to claim 1, wherein an encapsulant is disposed into each of the plurality of cells not containing the encapsulant mixed with phosphor.

5. The light-emitting device according to claim 1, further comprising:

a plurality of transparent covers, each of the plurality of transparent covers being disposed over one of the plurality of cells.

6. The light-emitting device according to claim 5, further comprising an encapsulant disposed into each of the plurality of cells.

7. The light-emitting device according to claim 5, wherein at least two of the plurality of the transparent covers are coated with or filled with phosphor of different colors.

8. A method for manufacturing a light-emitting device, comprising:

manufacturing a substantially flat substrate;

disposing a plurality of cells on the substrate, the plurality of cells defined by a plurality of support members, each having an upper face and are configured to eliminate cross-talk between a plurality of light emitting diodes (LEDs);

disposing a plurality of transparent covers, each disposed directly on the upper faces of the support members to close a corresponding cell cavity, each transparent cover comprising a lens to focus light emitted from the corresponding cell into an appropriate direction;

disposing the plurality of LEDs into the plurality of cells, wherein each of the plurality of cells accommodates at least one of the plurality of LEDs;

disposing an encapsulant filled with phosphor into at least two of the plurality of cells, wherein at least two of the plurality of cells contains the encapsulant filled with phosphor of different colors;

applying a reflective surface on a top surface of the plurality of cells; and forming a single outer cover disposed over the substrate that is in contact with the top surface of the substrate.

9. The method according to claim 8, further comprising disposing an encapsulant into each of the plurality of cells.

10. The method according to claim 8, further comprising disposing phosphor into at least one of the plurality of cells.

11. The method according to claim 8, wherein an encapsulant is disposed into each of the plurality of cells not containing the encapsulant filled with phosphor.

12. The method according to claim 8 further comprising disposing a transparent cover over each of the plurality of cells.

13. The method according to claim 12, further comprising disposing an encapsulant into each of the plurality of cells.

14. The method according to claim 12, wherein at least one of the plurality of the transparent covers is coated with or filled with phosphor.

15. The method according to claim 12, wherein at least two of the plurality of the transparent covers are coated with or filled with phosphor of different colors.

* * * * *